(12) United States Patent
Kushida et al.

(10) Patent No.: US 6,518,629 B1
(45) Date of Patent: Feb. 11, 2003

(54) SEMICONDUCTOR DEVICE AND PROCESS FOR PRODUCING THE DEVICE

(75) Inventors: Tomoyoshi Kushida, Seto (JP); Katsuhiko Nishiwaki, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 27 days.

(21) Appl. No.: 09/609,388

(22) Filed: Jul. 3, 2000

(30) Foreign Application Priority Data

Jul. 1, 1999 (JP) .......................................... 11-187880

(51) Int. Cl.[7] .................... H01L 29/76; H01L 29/94; H01L 29/74
(52) U.S. Cl. .................. 257/378; 257/337; 257/341; 438/259; 438/309; 438/138
(58) Field of Search ................. 257/378, 762, 257/197, 198, 329, 330, 331, 332, 339, 341, 342, 139, 140, 146, 147; 438/138, 135, 133, 259, 309

(56) References Cited

U.S. PATENT DOCUMENTS 5,814,858 A * 9/1998 Williams ..................... 257/328
6,218,217 B1 * 4/2001 Uenishi et al. .............. 438/138
6,455,902 B1 * 9/2002 Voldman ..................... 257/378

FOREIGN PATENT DOCUMENTS

JP         09-331063       12/1997

OTHER PUBLICATIONS

Kang et al., Trench emitter IGBT with lateral and vertical MOS channels, Microelectronics, 2002. MIEL 2002. 23rd International Conference on, vol. 2002, pp. 163–166, vol. 1.*

* cited by examiner

*Primary Examiner*—Olik Chaudhuri
*Assistant Examiner*—(Vikki) Hoa B. Trinh
(74) *Attorney, Agent, or Firm*—Pillsbury Winthrop LLP

(57) ABSTRACT

In a semiconductor device having high voltage resistance and low ON voltage characteristics, charge-storage regions (insulation layer) are formed in a drift region. Formed above the drift region are a channel region, an emitter region, trench-type gate electrodes, and an emitter electrode. Strips of the insulation layer extend in a direction intersecting a direction of extension of the gate electrodes, and form a stripe pattern. The insulation layer curbs extraction of holes into the channel region. Openings in the stripe pattern of the insulation layer form depletion layers.

14 Claims, 7 Drawing Sheets

GATE EXTENSION DIRECTION

SEMICONDUCTOR DEVICE AND PROCESS FOR PRODUCING THE DEVICE

The disclosure of Japanese Patent Application No. HEI 11-187880 filed on Jul. 1, 1999 including the specification, drawings and abstract is incorporated herein by reference in its entirety.

BACKGROUND OF THE INVENTION

1. Field of the Invention

The present invention relates to a semiconductor device and, more particularly, to a semiconductor device having the characteristics of high voltage resistance and low ON voltage. The present invention also relates to a process for producing such a device, the manufacturing process providing a high yield and being simpler than know manufacturing processes.

2. Description of the Related Art

In semiconductor devices, such as IGBTs (insulated gate bipolar transistors) and the like, it is necessary to improve the breakdown resistance by extracting many holes from a p-channel region into an emitter electrode. However, simultaneously with the extraction of holes from the p-channel region, holes are also extracted from an n-drift region adjacent to the p-channel region, thereby causing a problem of an increased ON voltage.

To avoid this problem, a device structure in which insulation layers are provided between trench gates arranged with a predetermined pitch has been proposed (e.g., in Japanese Patent Application Laid-Open No. HEI 9-331063). When the semiconductor is in an OFF state, the insulation layers operate as capacitors so as to improve the breakdown voltage, and when the semiconductor is in an ON state, the insulation layers prevent holes from being drawn into p-channel regions and reduce the saturation voltage so as to reduce the ON voltage. The insulation layers are formed by silicon oxide films or the like, and extend in a direction of extension of trench gates, and have a reduced thickness of about 0.3 $\mu$m. This configuration of the insulation layers is considered to improve the breakdown voltage.

However, in the above-described device structure, the insulation layers are formed at a position that is shallower than the position of the bottoms of the trench gates, in view of the saturation voltage. Furthermore, the insulation layers are disposed so that the distance between the insulation layers and the trench gates become equal to a predetermined value. Therefore, the following problem occurs. If a misalignment occurs between the trench gates and the insulation layers so that the distance therebetween changes, the device or element characteristics are greatly affected.

SUMMARY OF THE INVENTION

Accordingly, it is an object of the invention to provide an improved structural arrangement for a semiconductor device that has the characteristics of high voltage resistance and low ON voltage.

An insulated gate type semiconductor device according to the invention includes a gate electrode, a drift region of a first conductivity type, a channel region of a second conductivity type, and a plurality of charge-storage regions formed near an interface between the drift region and the channel region. The charge-storage regions continuously extend in a direction intersecting a direction of extension of the gate electrode.

This structure achieves improved characteristics due to the charge-storage regions (insulation layer or the like) and, furthermore, has a characteristic configuration of the charge-storage regions. That is, the invention does not incorporate a charge-storage region that is formed as a single body (continuous body) extending parallel to a direction of extension of the insulated gate, but incorporates a plurality of charge-storage regions that extend in a direction intersecting the direction of extension of the gate. The charge-storage regions form a stripe pattern, leaving intervals (opening regions) between the charge-storage regions. The opening regions of the stripe pattern of the charge-storage regions function as channels. Therefore, the element characteristics (that is, voltage resistance or ON voltage) can be determined by the proportion of the opening regions in the stripe pattern.

As a result, the characteristics are not determined depending on the alignment with the insulated gate, and can easily be set. The charge-storage regions may have a length that extends substantially across an element cell. This structure also achieves uniform element characteristics regardless of the alignment with the insulated gate.

BRIEF DESCRIPTION OF THE DRAWINGS

The foregoing and further objects, features and advantages of the present invention will become apparent from the following description of preferred embodiments with reference to the accompanying drawings, wherein like numerals are used to represent like elements and wherein.

DETAILED DESCRIPTION OF PREFERRED EMBODIMENTS

Preferred embodiments of the invention will be described in detail hereinafter with reference to the accompanying drawings.

Figure 1:
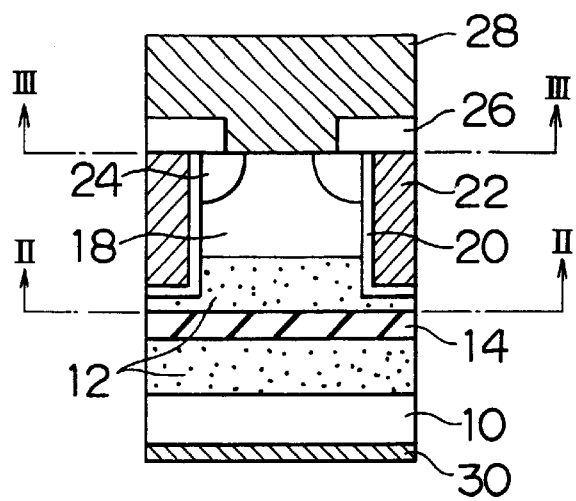
FIG. 1 is a longitudinal sectional view of a semiconductor device according to a first embodiment of the invention.
Figure 2:
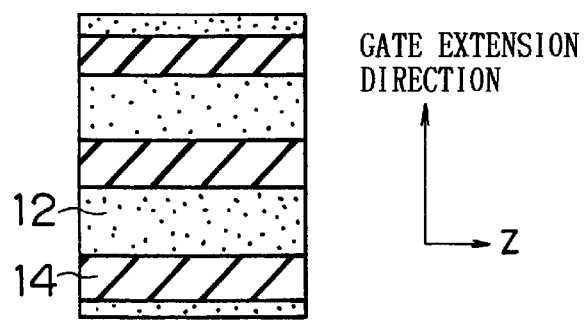
FIG. 2 is a sectional view taken on line II—II in FIG. 1.
Figure 3:
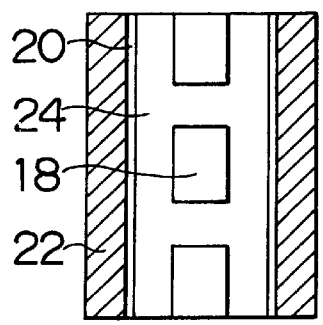
FIG. 3 is a sectional view taken on line III—III in FIG. 1.

FIG. 1 is a longitudinal sectional view of an IGBT according to a first embodiment of the invention. FIGS. 2 and 3 are sections taken on lines II—II and III—III in FIG. 1. An n⁻ drift region 12 is formed on a p⁺ type substrate 10, and a p-channel region 18 is formed on the n⁻ drift region 12. In the p-channel region 18, n⁺ emitter regions 24 are formed. Trench-type gate electrodes 22 are formed in such a manner as to sandwich the p-channel region 18 via gate oxide films 20. The n⁺ emitter regions 24 are connected to an emitter electrode 28 that is insulated from the gate electrodes 22 by oxide films 26. A collector electrode 30 is connected to the opposite side (lower portion in FIG. 1) of the p+ type substrate 10.

In this structure, an insulation layer 14 is formed as a charge-storage layer within the n⁻ drift region 12. As shown in FIG. 1, an insulation layer 14 is formed within the n⁻ drift region 12, at a position that is deeper than the position of the gate electrodes 22. As can be seen in FIG. 2, the strips of the insulation layer 14 extend in a direction (direction Z in FIG. 2) that intersects a direction of extension of the gate electrodes 22, and form a stripe pattern in the direction of extension of the gate electrodes 22. In regions between the strips of the insulation layer 14, that is, in opening regions of the insulation layer 14, the n-drift region 12 exists. The strips of the insulation layer 14 are not necessarily formed by insulator members, such as silicone oxide films or the like, but may also be formed from a semiconductor material having a high concentration of an n-type conductivity impurity than n⁻ drift region 12. The thickness of the insulation layer 14 may be at most about 30 µm.

The provision of the insulation layer 14 as a charge-storage region within the n⁻ drift region 12 considerably prevents extraction of holes from the n⁻ drift region 12, and therefore reduces the ON voltage. Since the insulation layer 14 is formed in a stripe pattern having opening regions, a depletion layer appears on the insulation layer 14 and extends through the opening regions of the insulation layer 14 and reaches lower portions of the insulation layer 14, so that the strength of an electric field between the p-channel region 18 and the insulation layer 14 is restricted within a predetermined value and the voltage resistance can be improved.

Furthermore, the strips of the insulation layer 14 do not extend in the direction of extension of the gate electrodes 22, but extend in a direction (direction Z in FIG. 2) intersecting the direction of extension of the gate electrodes 22, at a position deeper than the position of the gate electrodes 22, and form a stripe pattern. Therefore, device or element characteristics can be determined by dimension of the opening regions of the insulation layer 14. Furthermore, since the requirement for considering the alignment between the insulation layer 14 and the gate electrodes 22 disappears, the IGBT can easily be fabricated.

A method for fabricating an IGBT as shown in FIGS. 1 to 3 is schematically illustrated in FIGS. 4A–4H.

First, an n⁻ drift region 12 (lower layer portion) is epitaxially grown on a p+ type substrate (p+ collector region) 10. Then, an insulation layer 14 (or n+ region) is formed in a stripe pattern within the n⁻ drift region 12 by a photolithography process, an ion implantation process and a diffusion process. After that, an n⁻ drift region 12 (upper layer portion) is epitaxially grown on top of the insulation layer 14, thereby sandwiching the insulation layer 14. In this manner, the striped insulation layer 14 is formed within the n⁻ drift region 12 (see FIG. 4A). The precision of the opening regions of the striped insulation layer 14 is determined depending on the precision of a mask used in the photolithography process.

Figure 4A:
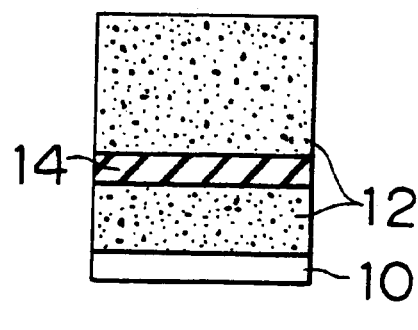
FIGS. 4A–4H illustrate a method of fabricating the semiconductor device shown in FIG. 1.
Figure 4B:
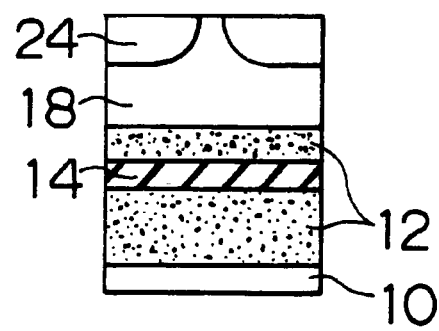
Figure 4C:
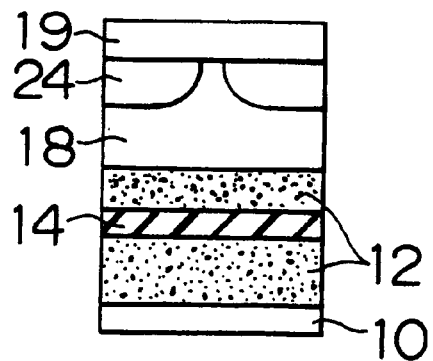
Figure 4D:
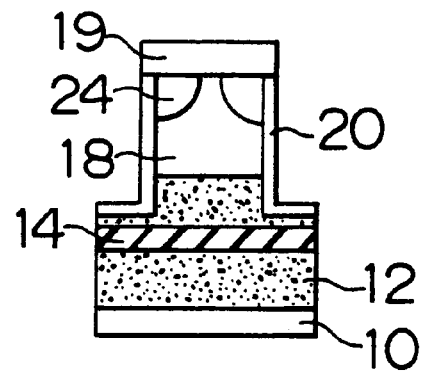
Figure 4E:
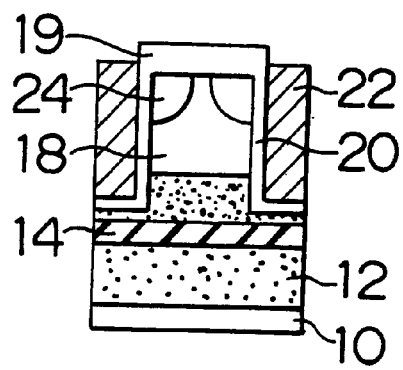
Figure 4F:
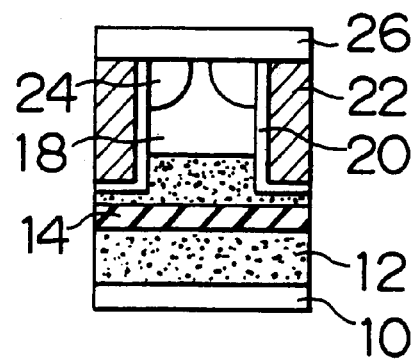

Next, a p-channel region 18 and n+ emitter regions 24 are formed on a surface of the n⁻ drift region 12 by a photolithography process, an ion implantation process and a diffusion process (see FIG. 4B). On top of it, an oxide film 19 is formed (to a thickness of 400 nm as for example) by a CVD method (see FIG. 4C). The oxide film 19 is then dry-etched by using a resist mask that is formed through a photolithography process. After the resist is removed, the oxide film 19 is used as a mask to dry-etch about 6 µm so as to form a trench-structure. About 50 nm of each trench side wall is oxidized by thermal oxidation, and oxidized portions are removed by hydrofluoric acid. Then, 50 nm of each trench side wall is etched by chemical dry etching. After that, thermal oxidation is performed to form gate oxide films 20 of about 100 nm (see FIG. 4D).

After that, the trenches are buried with polycrystalline silicon or the like by a CVD method, and boron is diffused thereinto to form p+ regions. The entire surface of each buried region is etched back by dry etching so that the upper end of each buried region comes approximately to a position corresponding to half the thickness of the oxide film 19 (that is, the etching-back depth is approximately equal to half the thickness of the oxide film 19), thereby forming gate electrodes 22 (see FIG. 4E). Subsequently, a surface portion of each gate electrode 22 is oxidized by thermal oxidation to an amount of about 400 nm (that is, such an amount of oxidation that an upper end of each oxidized portion becomes substantially flush with the upper surface of the oxide film 19), thereby forming an oxide film 26 (see FIG. 4F).

Figure 4G:
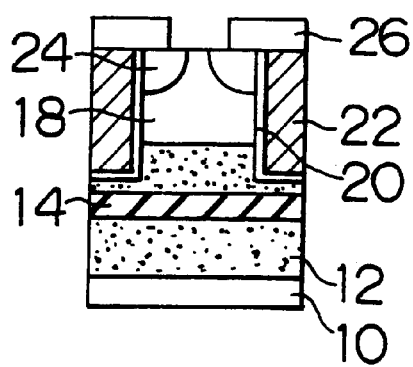
Figure 4H:
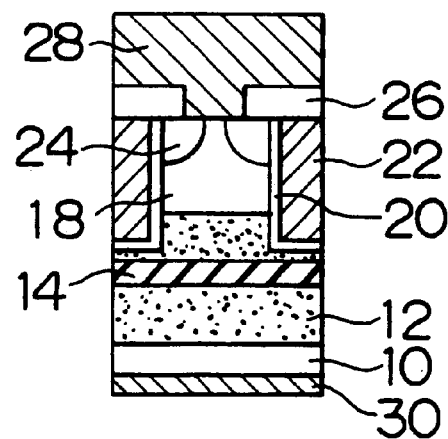

After that, an opening is formed in the oxide film 26 by a photolithographic process and dry etching (see FIG. 4G). Then, an emitter electrode 28 (Al, for example) is formed by using a sputtering method, and is formed into a desired configuration by photolithography or etching. Furthermore, a collector electrode 30 (Ti/Ni/Au, for example) is formed by using a sputtering method (see FIG. 4H).

Thus, the semiconductor device fabricating process illustrated in FIGS. 4A–4H) does not require mask alignment for the gate electrodes 22 and the insulation layer 14. Therefore, the semiconductor device shown in FIG. 1 can easily be fabricated by the above-described process.

Although in the foregoing embodiment, the insulation layer 14 (or the n+ region) is formed within the n⁻ drift region 12, an insulation layer 14 may instead be formed in the p-channel region 18, at a site near the interface with the n⁻ drift region 12 (including a site on the interface).

Figure 5:
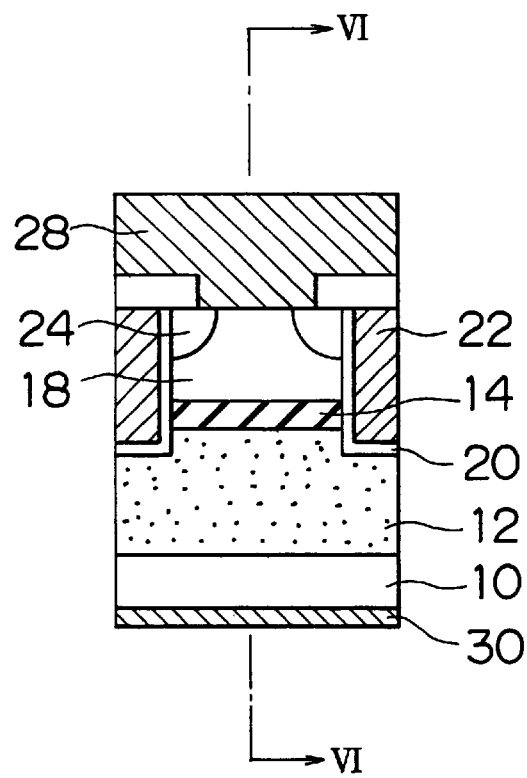
FIG. 5 is a longitudinal sectional view of a semiconductor device according to a second embodiment of the invention.
Figure 6:
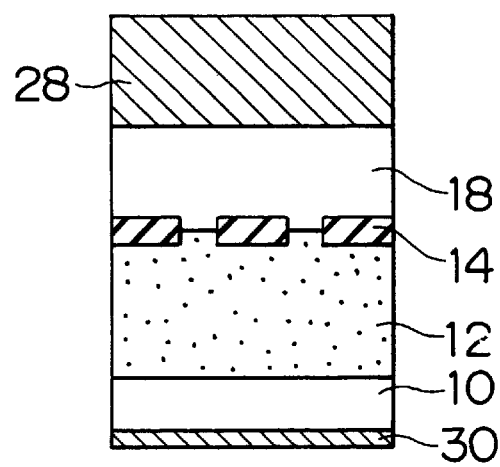
FIG. 6 is a sectional view taken on line VI—VI in FIG. 5.

FIGS. 5 and 6 illustrate a second embodiment of an IGBT according to the invention. An insulation layer 14 (or n+ region) as a charge-storage region is formed on the interface between an n⁻ drift region 12 and a p-channel region 18. FIG. 5 is a longitudinal sectional view of the IGBT. FIG. 6 is a section taken on line VI—VI in FIG. 5.

In the second embodiment, opposite ends of the insulation layer 14 reach gate oxide films 20, and no channel is formed between the insulation layer 14 and the gate oxide films 20. The insulation layer 14 is formed at a position that is shallower than the position of the bottoms of trench-type gate electrodes 22. In the second embodiment, strips of the insulation layer 14 do not extend in a direction of extension of the gate electrodes 22, but extend in a direction intersecting the direction of extension of the gate electrodes 22, and the strips of the insulation layer 14 form a stripe pattern (see FIG. 6), as in the first embodiment. In a structure where a channel is formed between the insulation layer 14 and the gate oxide films 20, the conformity (mask alignment) between the insulation layer 14 and the gate oxide films 20 becomes important. In the embodiment, however, the opening regions of the striped insulation layer 14 function as channel, and therefore the precision of the opening portions affects the device characteristics. Hence, since the effect of conformity or alignment between the insulation layer 14 and the gate electrodes 22 is small, a semiconductor device (IGBT) can easily be fabricated.

Figure 7:
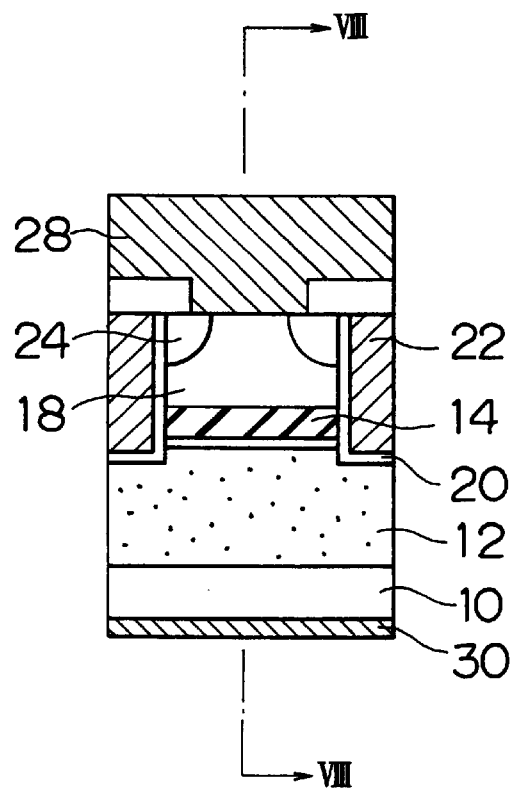
FIG. 7 is a longitudinal sectional view of a semiconductor device according to a third embodiment of the invention.
Figure 8:
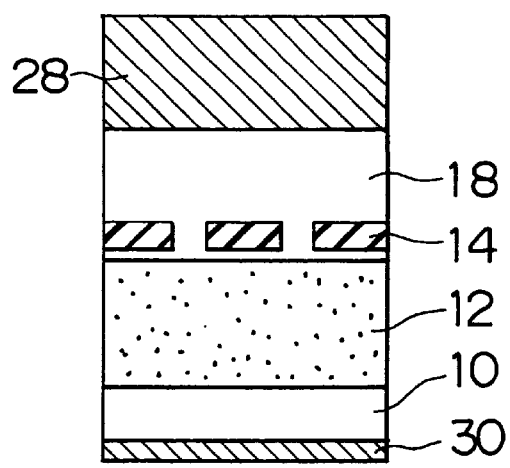
FIG. 8 is a sectional view taken on line VIII—VIII in FIG. 7.

FIGS. 7 and 8 illustrate a third embodiment of the IGBT according to the invention. An insulation layer 14 (or n+ region) is formed within a p-channel region 18, in the vicinity of the interface with an n⁻ drift region 12. FIG. 7 is a longitudinal sectional view of the IGBT. FIG. 8 is a sectional view taken on line VIII—VIII in FIG. 7. The relative position of the insulation layer 14 to gate electrodes 22 is substantially the same as in the second embodiment. Therefore, in the IGBT fabricating process, the effect of conformity or alignment between the insulation layer 14 and the gate electrodes 22 can be reduced. The purpose of providing the insulation layer 14(or n⁺ region) is to curb extraction of holes from the n⁻ drift region 12 into the p-channel region 18. Therefore, it is desirable that the insulation layer 14 (or n⁺ region) be formed as close to the interface as possible.

Figure 9:
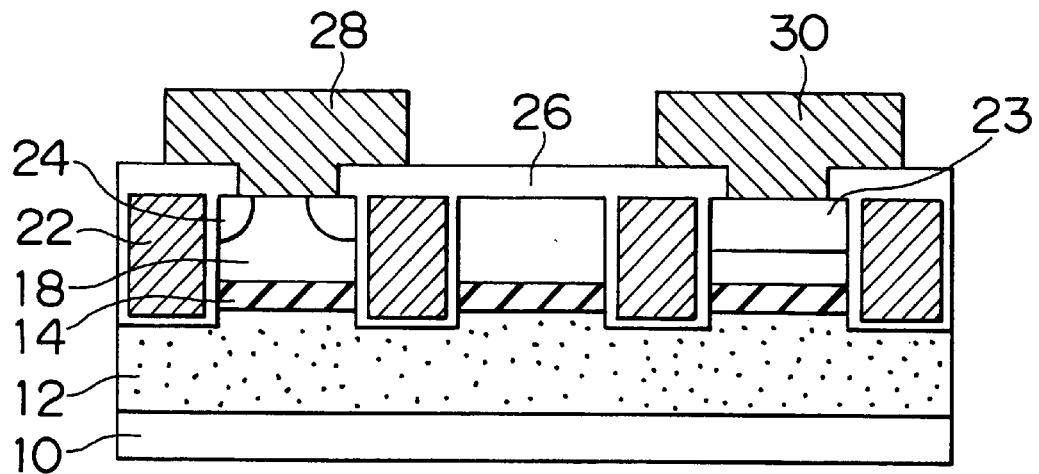
FIG. 9 is a longitudinal sectional view of a semiconductor device according to a fourth embodiment of the invention.

FIG. 9 illustrates a fourth embodiment of the IGBT according to the invention. The fourth embodiment shows how the principles of the invention can be applied to a planar-type IGBT in which an emitter electrode 28 and a collector electrode 30 are formed on an equal layer. An n⁻-drift region 12 is formed on a p⁺ type substrate 10, and an insulation layer 14 (or n⁺ region) is formed as a charge-storage region in the n⁻ drift region 12. Trench-type gate electrodes 22 are formed with a predetermined pitch, and p-channel regions 18 and n⁺ emitter regions 24 are formed between the gate electrodes 22, and are connected to an emitter electrode 28. A p⁺ collector region 23 is formed to a depth substantially equal to the depth of the n⁺ emitter regions 24, and is connected to a collector electrode 30. The emitter electrode 28 and the collector electrode 30 are insulated from each other by an oxide film 26.

In the fourth embodiment, too, strips of the insulation layer 14 extend in a direction intersecting a direction of extension of the gate electrodes 22, and form a stripe pattern. The insulation layer 14 is able to curb extraction of holes into the p-channel region 18.

Although in the foregoing embodiments, the strips of the insulation layer 14 (or n⁺ region) extend in the direction (direction "Z" in FIG. 2) intersecting the direction of extension of the gate electrodes 22, and form a stripe pattern, the direction Z does not need to be perpendicular to the direction of extension of the gate electrodes 22, but only needs to be unparallel to the direction of extension of the gate electrodes 22. Therefore, the invention permits increased variation of the fabrication process of semiconductor devices.

Figure 10:
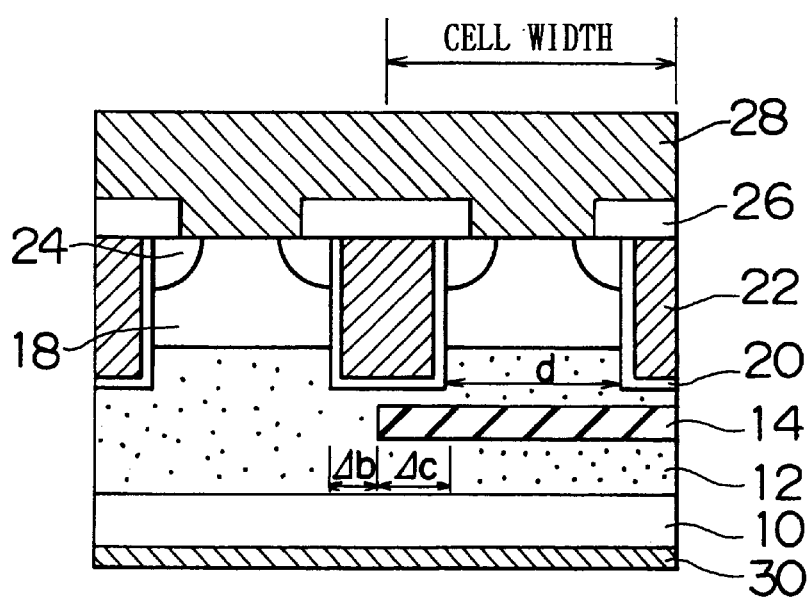
FIG. 10 is a longitudinal sectional view of a semiconductor device according to a fifth embodiment of the invention.

FIG. 10 illustrates a fifth embodiment of the IGBT according to the invention. An n⁻-drift region 12 is formed on a p⁺ type substrate 10, and p-channel regions 18 are formed on the n⁻ drift region 12. In each p-channel region 18, n⁺ emitter regions 24 are formed. Trench-type gate electrodes 22 are formed in such a manner as to sandwich the p-channel regions 18 via gate oxide films 20. The n⁺ emitter regions 24 are connected to an emitter electrode 28. The emitter electrode 28 is insulated from the trench-type gate electrodes 22 by oxide films 26. A collector electrode 30 is connected to an opposite side of the p⁺-substrate 10. An insulation layer 14 (or n⁺ region) is formed as a charge-storage region within the n⁻ drift region 12. In the fifth embodiment, the insulation layer 14 continuously extends along extension of the gate electrodes 22, that is, parallel to the direction of extension of the gate electrodes 22, and the insulation layer 14 is formed at a position that is below lower ends of the gate electrodes 22. The length (width) of the insulation layer 14 is set so that opposite end portions of the insulation layer 14 are located under gate electrodes 22. That is, the length of the insulation layer 14 is greater than an interval "d" of gate electrodes within a transistor cell, and is set so that an end portion does not reach a region under the p-channel region 18 of an adjacent transistor cell. The length of the insulation layer 14 that satisfies the aforementioned conditions has allowances. For example, the length of a left end portion of the insulation layer 14 in FIG. 10 has an allowance of Δb leftward in FIG. 10 (in a length-increasing direction), and has an allowance of Δc rightward in FIG. 10 (in a length-decreasing direction). The presence of the insulation layer 14 substantially across a transistor cell makes it easy to achieve uniform characteristics in the transistor cell even if the positional relationship between the gate electrodes 22 and the insulation layer 14 deviates to some extent at the time of formation of the insulation layer 14. In this embodiment, the provision of the insulation layer 14 improves voltage resistance and reduces the ON voltage as in the foregoing embodiments.

Even though the insulation layer 14 is formed at a position that is deeper than the lower ends of the gate electrodes 22, the saturation voltage does not considerably increase. Furthermore, uniform characteristics can be achieved regardless of fabrication condition (more precisely, alignment precision).

Although in FIG. 10, the insulation layer 14 is formed so that the opposite ends of the insulation layer 14 are located under the two adjacent gate electrodes 22 of a transistor cell, the insulation layer 14 may be formed so as to extend astride two or more transistor cells. In that case, the characteristics of the two or more transistors can be uniformed (more specifically, current densities can be uniformed) by positioning opposite ends of the insulation layer 14 under gate electrodes 22.

Figure 11:
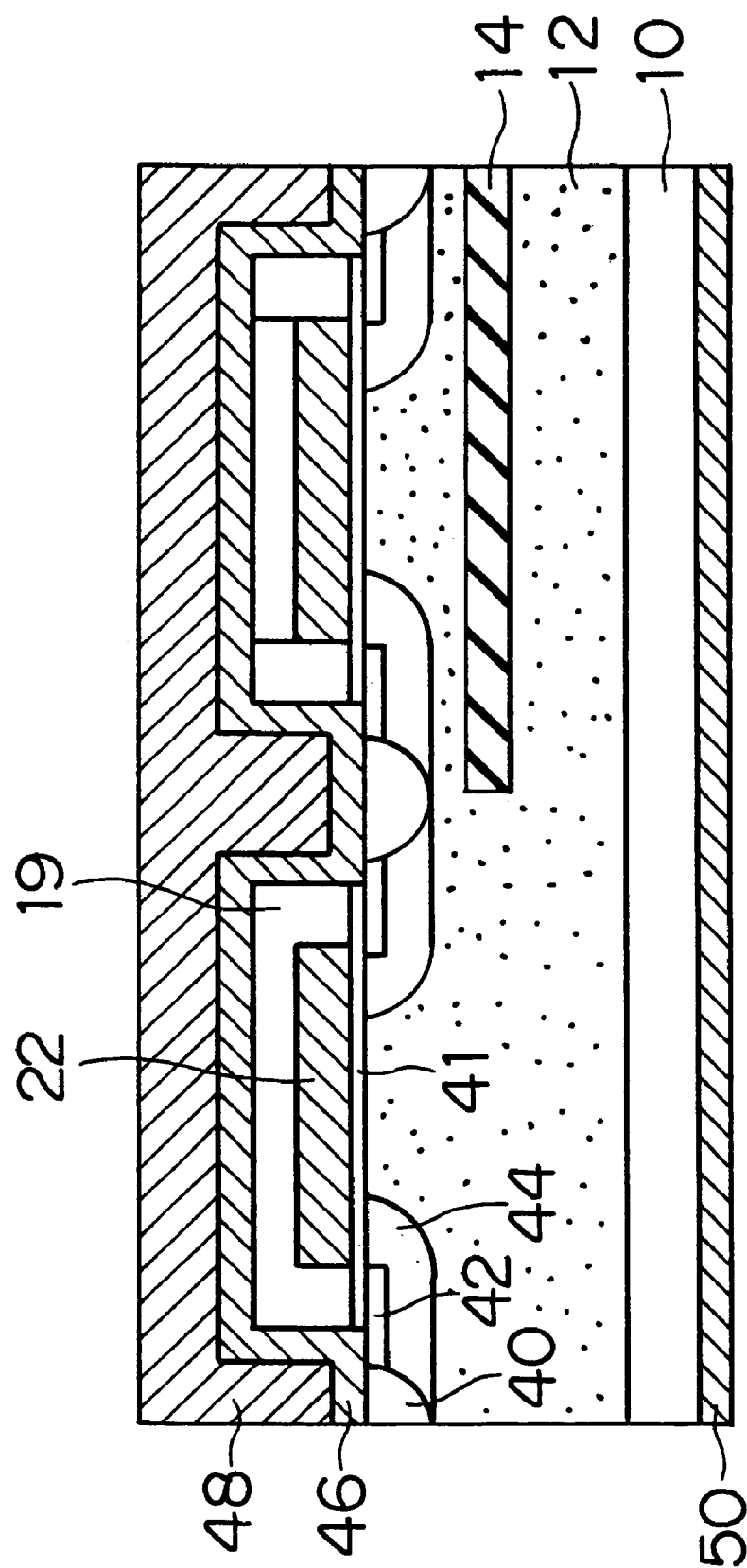
FIG. 11 is a longitudinal sectional view of a semiconductor device according to a sixth embodiment of the invention.

FIG. 11 illustrates a sixth embodiment of the IGBT according to the invention. In the sixth embodiment, the invention is applied to a planar-gate type IGBT.

In the sixth embodiment, an n⁻-drift region 12 is formed on a p⁺ type substrate 10, and an insulation layer 14 (or n⁺ region) is formed within the n⁻ drift region 12. Formed on the n drift region 12 are p-base regions 44 in which p⁺ base regions 40 and n⁺ emitter regions 42 are formed. Gate electrodes 22 are formed on gate oxide films 41 that are formed on portions of the n⁻ drift region 12 where neither base regions nor emitter regions are existed. The n⁺ emitter regions 42 are connected to an emitter electrode 46 on which a source electrode 48 is formed. The emitter electrode 46 is insulated from the gate electrodes 22 by insulation layers 19. A collector electrode 50 is connected to the p⁺ type substrate 10.

As is apparent in FIG. 11, opposite ends of the insulation layer 14 are located under adjacent p⁺ base regions 40. That is, the insulation layer 14 has a length that extends substantially across a transistor cell. Therefore, this embodiment also easily achieves uniform characteristics of the transistor cell. The "length that extends substantially across a transistor cell" means that the length of the insulation layer 14 extends substantially throughout the width of the drift region. If a plurality of cells exist side by side, the insulation layer may be formed so as to extend substantially throughout the entire width of the drift regions of the cells.

The invention is also applicable to a semiconductor device in which each layer (region) has the opposite conductivity with respect to their conductivities described in the foregoing embodiments.

Furthermore, it is also possible to further provide an n⁺ buffer layer between the p⁺ type substrate 10 and the n⁻ drift region 12 in, for example, a structure as shown in FIG. 1.

Still further, the IGBT according to the invention has a great allowance for conformity or alignment with respect to the position of the insulation layer (or a region having a higher impurity concentration than the drift region). Therefore, although in the foregoing embodiments, each transistor cell has a rectangular shape, the shape of each cell may be arbitrary (for example, a circular shape, a polygonal shape, or other shapes).

Although in the foregoing embodiments, the $p^+$ type substrate and the $n^-$ drift region are formed from silicon, the material combination of $p^+$ type substrate/$n^-$ drift region may also be, for example, Ge/Si, SiGe/Si, Si/GaN, Si/GaAs, or Si/SiC.

Furthermore, in the IGBTs shown in FIGS. 1 to 5, the balance between the charge storage effect and the charge injection amount can be adjusted by changing the area of the opening regions of the insulation layer 14 provided as a charge storage region. Therefore, an optimal switching speed can be achieved by setting an area of the opening in accordance with the purpose of use of the device. In general, the switching speed can be increased by increasing the area of opening. In the invention, the device or element characteristics can easily be adjusted to optimal values by forming the insulation layer 14 into a stripe pattern so as to have opening regions.

Although in the foregoing embodiments, the insulation layer or a semiconductor region that has a higher impurity concentration than the drift region is used as a charge-storage region, the charge-storage region may also be consisted of a material that has wider band gap than the material of the drift region. For example, if the drift region is formed from silicon, the charge-storage region may be formed from SiC, GaN, GaAs, or the like. If the drift region is formed from germanium, the charge-storage region may be formed from silicon, SiC, GaN, GaAs, or the like.

As is apparent from the above-description, the invention is able to increase the voltage resistance and reduces the ON voltage, and is also able to provide a semiconductor device that is easy to fabricate and that has stable characteristics.

While the present invention has been described with reference to what are presently considered to be preferred embodiments thereof, it is to be understood that the present invention is not limited to the disclosed embodiments or structures. On the contrary, the present invention is intended to cover various modifications and equivalent arrangements. In addition, while the various elements of the disclosed invention are shown in various combinations and configurations, which are exemplary, other combinations and configurations, including more, less or only a single embodiment, are also within the spirit and scope of the present invention.

What is claimed is:

1. An insulated gate type semiconductor device comprising:
   a gate electrode;
   a drift region of a first conductivity type;
   a channel region of a second conductivity type;
   an emitter region of the first conductivity type formed in the channel region;
   a collector region of the second conductivity type formed as a substrate of the insulated gate type semiconductor device; and
   a plurality of charge-storage regions contacted with at least one of the drift region and the channel region, the charge-storage regions continuously extending in a direction intersecting a direction of extension of the gate electrode,
   wherein the insulated gate type semiconductor device is an insulated gate bi-polar transistor.

2. A semiconductor device according to claim 1, wherein the charge-storage regions are formed within the channel region, in the vicinity of the interface with the drift region.

3. A semiconductor device according to claim 1, wherein the charge-storage regions are insulators.

4. A semiconductor device according to claim 1, wherein a concentration of an impurity of the first conductivity type in the charge-storage regions is higher than in the drift region.

5. A semiconductor device according to claim 1, wherein the charge-storage regions comprises material having a wider band gap than that of the drift region.

6. An insulated gate type semiconductor device comprising:
   a drift region of a first conductivity type;
   an emitter region of the first conductivity type formed in a channel region;
   a collector region of a second conductivity type formed as a substrate of the insulated gate type semiconductor device; and
   a charge-storage region formed in the drift region, the charge-storage region having a length that extends substantially across an element cell,
   wherein the insulated gate type semiconductor device is an insulated gate bi-polar transistor.

7. A semiconductor device according to claim 6, wherein the charge-storage region is an insulator.

8. A semiconductor device according to claim 6, wherein a concentration of an impurity of the first conductivity type in the charge-storage region is higher than in the drift region.

9. A semiconductor device according to claim 6, wherein the charge-storage region comprises a material having wider band gap than that of the drift region.

10. A process for producing an insulated gate type semiconductor device comprising:
    forming a drift region having a first conductivity type on a semiconductor substrate;
    forming a channel region having a second conductivity type on the drift region;
    forming an emitter region of the first conductivity type in the channel region;
    forming a collector region of the second conductivity type as a substrate of the insulated gate type semiconductor device;
    forming a plurality of charge-storage regions which contact with at least one of the drift region and the channel region; and
    forming a gate electrode, wherein the charge-storage regions continuously extend in a direction intersecting a direction of extension of the gate electrode, and the insulated gate type semiconductor device is an insulated gate bi-polar transistor.

11. A process according to claim 10, wherein the charge-storage regions are formed within the channel region, in the vicinity of the interface with the drift region.

12. A process according to claim 10, wherein the charge-storage regions are insulators.

13. A process according to claim 10, wherein a concentration of an impurity of the first conductivity type in the charge-storage regions is higher than in the drift region.

14. A process according to claim 10, wherein the charge-storage regions comprise material having a wider band gap than that of the drift region.

* * * * *